(12) United States Patent
Jang et al.

(10) Patent No.: US 7,804,693 B2
(45) Date of Patent: Sep. 28, 2010

(54) PRINTED CIRCUIT BOARD HAVING STRUCTURE FOR RELIEVING STRESS CONCENTRATION, AND SEMICONDUCTOR CHIP PACKAGE EQUIPPED WITH THE SAME

(75) Inventors: Chang-soo Jang, Yongin-si (KR); Jae-chul Ryu, Yongin-si (KR); Seong-young Han, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 774 days.

(21) Appl. No.: 11/167,858

(22) Filed: Jun. 27, 2005

(65) Prior Publication Data

US 2006/0016619 A1 Jan. 26, 2006

(30) Foreign Application Priority Data

Jul. 22, 2004 (KR) ...................... 10-2004-0057141

(51) Int. Cl.
*H01R 9/00* (2006.01)
(52) U.S. Cl. ..................................................... 361/772
(58) Field of Classification Search ................. 361/772, 361/728, 813; 257/786, 668, 669; 174/260
See application file for complete search history.

(56) References Cited

U.S. PATENT DOCUMENTS

| 5,594,626 | A | * | 1/1997 | Rostoker et al. ............ 361/784 |
| 5,767,571 | A | * | 6/1998 | Kimura et al. .............. 257/668 |
| 5,825,081 | A | * | 10/1998 | Hosomi et al. .............. 257/668 |
| 5,920,115 | A | * | 7/1999 | Kimura et al. .............. 257/666 |
| 6,559,524 | B2 | | 5/2003 | Seko |
| 6,569,764 | B1 | * | 5/2003 | Hirashima et al. .......... 438/673 |
| 6,855,577 | B2 | * | 2/2005 | Azuma ....................... 438/118 |
| 7,002,240 | B2 | * | 2/2006 | Madrid ....................... 257/676 |
| 7,336,499 | B2 | * | 2/2008 | Hagiwara ................... 361/749 |
| 2003/0136573 | A1 | * | 7/2003 | Miyaki et al. .............. 174/52.4 |
| 2004/0104457 | A1 | * | 6/2004 | Tan et al. .................... 257/666 |
| 2004/0173884 | A1 | * | 9/2004 | Kashiwagi et al. .......... 257/668 |
| 2005/0133249 | A1 | * | 6/2005 | Fujii .......................... 174/250 |

FOREIGN PATENT DOCUMENTS

| JP | 05-183247 A | 7/1993 |
| JP | 2000-183271 A | 6/2000 |
| JP | 2000-306958 A | 11/2000 |
| KR | 2000-0034177 A | 6/2000 |

\* cited by examiner

*Primary Examiner*—Jinhee J Lee
*Assistant Examiner*—Abiy Getachew
(74) *Attorney, Agent, or Firm*—Drinker Biddle & Reath LLP

(57) ABSTRACT

There are provided a printed circuit board having a structure for relieving a stress concentration on an outer most lead of leads, due to a difference in thermal expansion coefficients between the semiconductor device and the printed circuit board when the semiconductor device is mounted on the printed circuit board. The printed circuit board includes an inner lead portion to be connected to the semiconductor device. The inner lead portion includes a plurality of leads, arranged in parallel with a same pitch in a predetermined area, and additional leads located near both ends of the predetermined area in which the plurality of leads are arranged in parallel, respectively, wherein each of the plurality of leads has a pitch smaller than 30 μm and a width of the additional lead is wider than 20 μm. There are also provided a semiconductor chip package equipped with the printed circuit board according to the present invention.

8 Claims, 7 Drawing Sheets

PRINTED CIRCUIT BOARD HAVING STRUCTURE FOR RELIEVING STRESS CONCENTRATION, AND SEMICONDUCTOR CHIP PACKAGE EQUIPPED WITH THE SAME

This application claims the priority of Korean Patent Application No. 10-2004-0057141, filed on Jul. 22, 2004, in the Korean Intellectual Property Office, the disclosure of which is incorporated herein in its entirety by reference.

BACKGROUND OF THE INVENTION

1. Field of the Invention

The present invention relates generally to a printed circuit board and a semiconductor chip package with the same, and more particularly, to a printed circuit board having a structure for relieving a stress concentration on corner leads that are connected to a semiconductor device on the printed circuit board, and a semiconductor chip package equipped with the same printed circuit board.

2. Description of the Related Art

Figure 1:
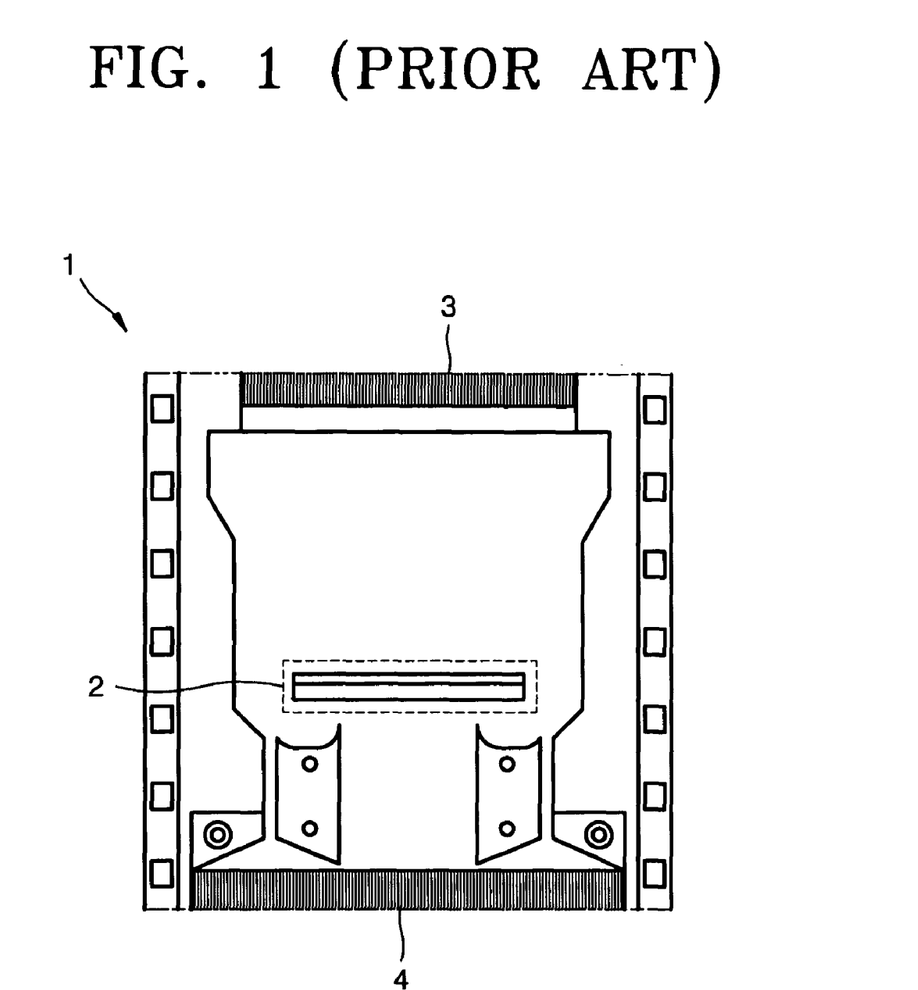
FIG. 1 is a top view of a flexible printed circuit board on which a semiconductor device for driving a liquid crystal display device is mounted, as an example of a conventional printed circuit board.

FIG. 1 is a top view of a flexible printed circuit board 1 connected to a display module of a liquid crystal display device, as an example of a printed circuit board on which a semiconductor device is mounted.

Referring to FIG. 1, an external connection terminal 3 to be connected to the display module of the liquid crystal display device is located in one side of the flexible printed circuit board 1, another external connection terminal 4 to be connected to a control panel allowing a user to control the liquid crystal display device is located in the other side of the flexible printed circuit board 1, and an inner lead portion 2 to be connected to a semiconductor device for driving is formed in a predetermined portion of the flexible printed circuit board 1. The semiconductor device for driving drives the liquid crystal display module according to a signal received from the control panel. An electrical and mechanical connection between the flexible printed circuit board 1 and the semiconductor device is achieved by connections between leads located in the inner lead portion 2 of the flexible printed circuit board 1 and bumps formed on the semiconductor device.

Figure 2:
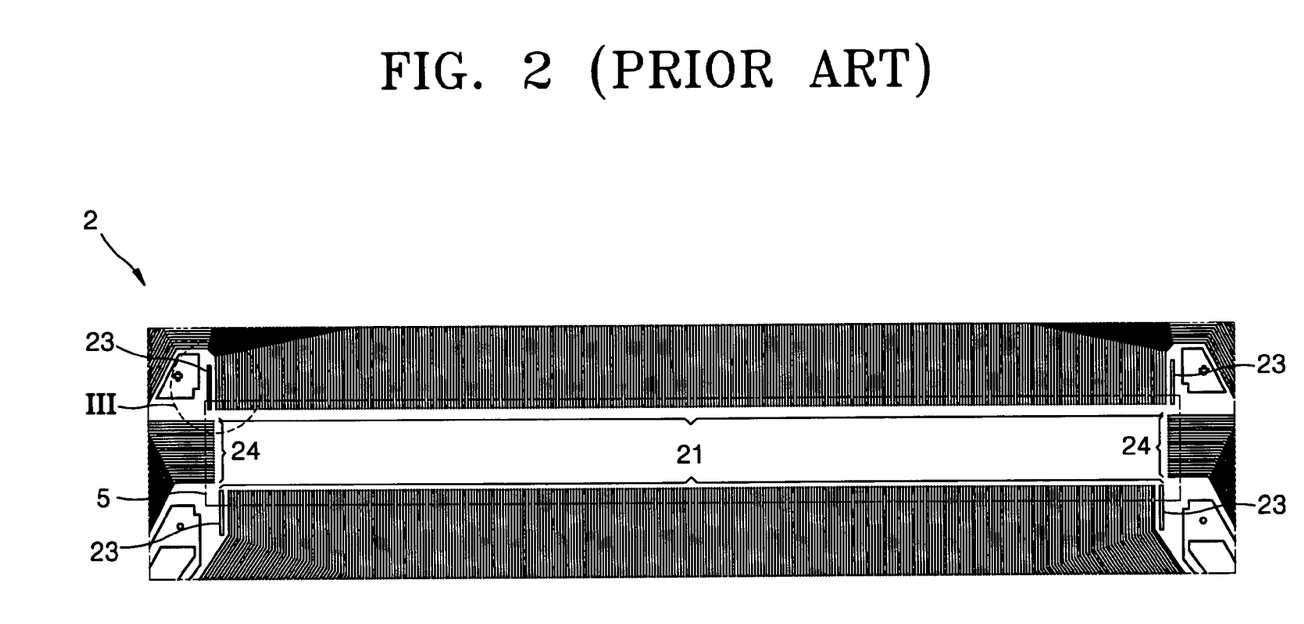
FIG. 2 is an enlarged view of an inner lead portion on the flexible printed circuit board shown in FIG. 1.

FIG. 2 is an enlarged view of the inner lead portion 2 on the flexible printed circuit board shown in FIG. 1.

Referring to FIG. 2, the inner lead portion 2 includes a plurality of leads 21 and 24. The leads 21 and 24 are arranged around a rectangular area on which a semiconductor device 5 will be mounted. That is, the leads 21 and 24 are perpendicular, respectively, to the four sides of the semiconductor device 5 with a rectangle shape.

Each of the leads 21 and 24, arranged as described above, is connected one-to-one with a bump 51 formed on the semiconductor device 5, thereby electrically and mechanically connecting the flexible printed circuit board 1 to the semiconductor device 5.

The one-to-one connection of the bump 51 and each of the leads 21 and 24 is achieved by Au—Sn eutectic bonding at a high temperature. However, a peel stress is concentrated on leads located near the corners of the semiconductor device 5, due to loads caused by a difference in thermal expansion coefficients between the flexible printed circuit board 1 and the semiconductor device 5 while the one-to-one connections are formed and cooled. Such concentration of the peel stress results in breakage of the leads. Accordingly, a solution for avoiding such breakage is needed.

Figure 3:
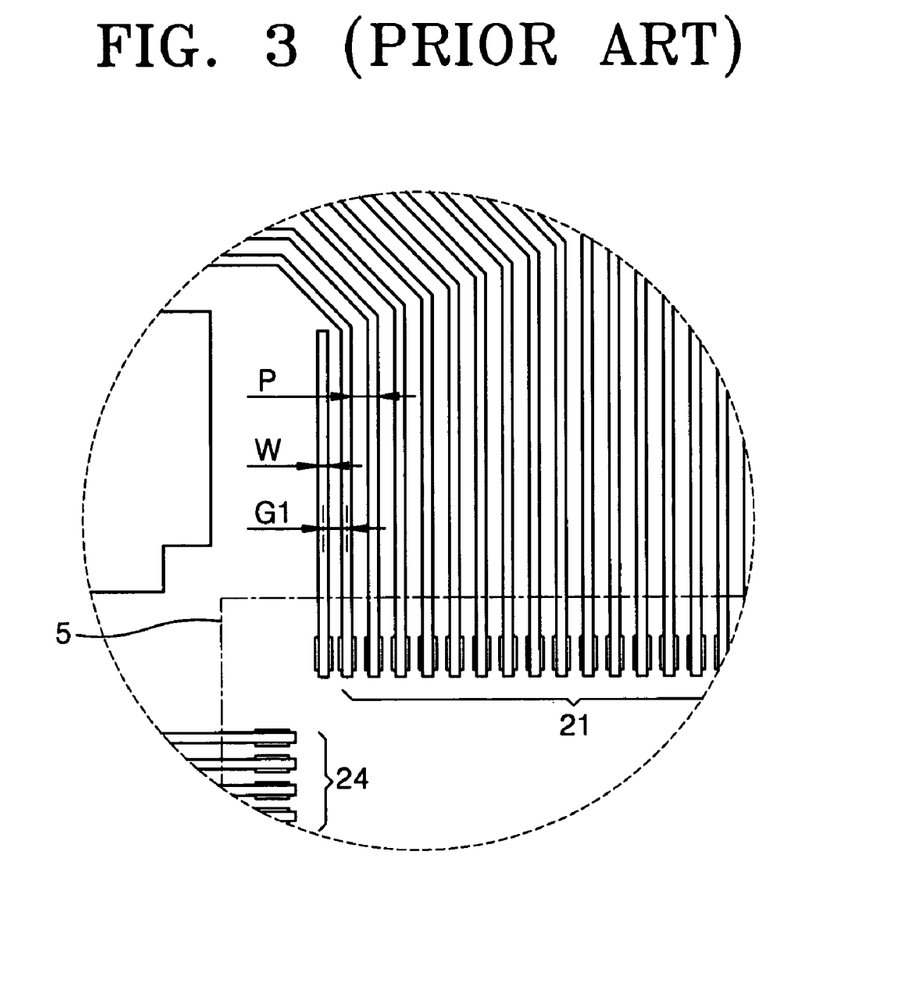
FIG. 3 is an enlarged view of a portion III of FIG. 2.

FIG. 3 is an enlarged view of a portion III of FIG. 2.

Referring to FIG. 3, conventionally, to relieve the stress concentration due to the difference in the thermal expansion coefficients and to prevent the breakage of the leads located near the corners of the semiconductor device 5, dummy leads 23 are formed near the edges of the longitudinal sides of the semiconductor device 5 and each of the dummy leads 23 is connected to a bump 51 on the semiconductor device 5. Therefore, the peel stress is concentrated on the dummy leads 23, thereby preventing the leads 21 through which signals are passed from being damaged.

However, in the conventional method in which the dummy leads 23 are formed, there is no design rule for the width (W) and length of a dummy lead, a distance (G1) between the dummy lead and a lead adjacent to the dummy lead, etc. In particular, if a pitch of a lead is smaller than 30 μm, a structure and design for relieving the stress concentration on the corner leads 21 using a quantified method is required.

SUMMARY OF THE INVENTION

The present invention provides a printed circuit board having a structure for relieving a stress concentration on corner leads that are arranged on the printed circuit board, due to a difference in thermal expansion coefficients between a semiconductor device and the printed circuit board when the semiconductor device is mounted on the printed circuit board. Also, the present invention provides a semiconductor chip package equipped with the same printed circuit board.

According to an aspect of the present invention, there is provided a printed circuit board, which includes an inner lead portion to be connected to a semiconductor device, the inner lead portion comprising: a plurality of leads, arranged in parallel, with the same pitch, around a predetermined area, and at least one additional lead located near at least one of the plurality of leads, wherein each of the plurality of leads has a pitch smaller than 30 μm and the width of the additional lead is wider than 20 μm.

The at least one additional lead is a dummy lead. Also, the distance between an additional lead and the outer most lead of the plurality of leads is within 0.8 mm.

According to another aspect of the present invention, there is provided a semiconductor package, which is formed by mounting a semiconductor device on a printed circuit board, comprising: a plurality of leads formed in parallel each with the same pitch smaller than 30 μm on the printed circuit board; at least one additional lead having a width wider than 20 μm and being formed adjacent to an outer most lead of the plurality of leads; and a plurality of bumps, formed in an area of the semiconductor device, corresponding to the plurality of leads and the additional lead.

The additional lead is a dummy lead and two or more additional leads are formed. Also, a distance between the additional lead and an outer most lead of the plurality of leads is within 0.8 mm. Also, the printed circuit board is a flexible printed circuit board.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings.

Figure 4:
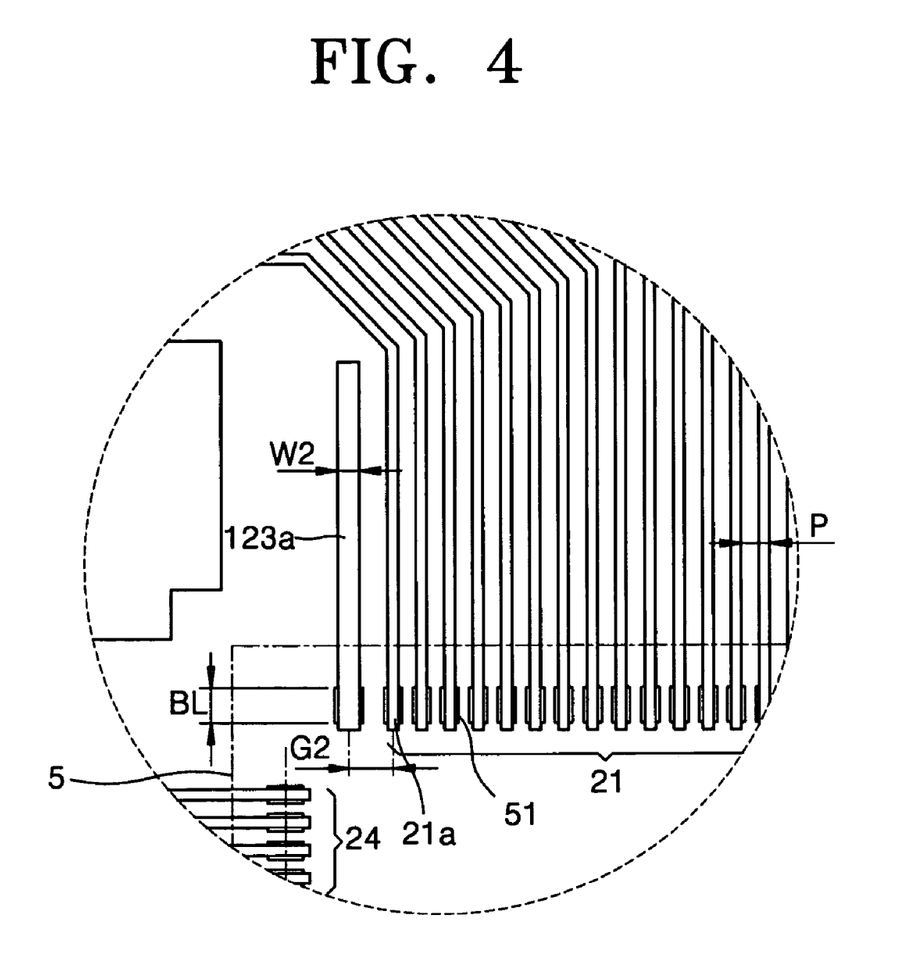
FIG. 4 is a view for explaining a stress relief structure of the printed circuit board according to the present invention.

FIG. 4 is a view for explaining a stress relief structure of a printed circuit board according to the present invention.

Referring to FIG. 4, when a semiconductor device 5 is mounted on the printed circuit board, in order to relieve the stress concentration on the leads located near the corners of the semiconductor device 5, an additional lead 123a is formed adjacent to the outer most lead of leads 21. The additional lead 123a has a width wider than that of each of the leads 21.

If the leads 21 are formed in parallel with a same pitch P smaller than 30 μm on the printed circuit board, the additional lead 123a will have a wider width of 20 μm or more according to the size of the semiconductor device 5.

It is preferable that an edge gap G2 between the additional lead 123a and an outer most lead 21a of the leads 21 is smaller than 0.8 mm in order to prevent stress concentrated on the additional lead 123a from being concentrated on the outer most lead 21a and the leads 21.

The width W2 of the additional lead 123a and the edge gap G2 are decided by the following procedure.

First, parameters that influence a peel stress of the leads 21 are selected.

The selected parameters are a lead pitch P, a bump length BL, a lead thickness, a lead bottom width, a lead etching factor, and a Polylmid (PI) tape thickness.

Then, a FEM analysis for these parameters is performed within a range shown in Table 1.

TABLE 1

| Parameter | Allowable Range |
|---|---|
| Lead pitch (P) | 25 μm~35 μm |
| Lead thickness (T) | 6 μm~10 μm |
| Lead width (W) | 12 μm~18 μm |
| Lead etching factor (E.f) | 2~4 |
| Bump length (BL) | 80 μm~120 μm |
| PI tape thickness | 30 μm~50 μm |

Generally, the lead width W represents a lead bottom width of a lead on a design pattern and the width of the top surface of the lead can be different from the lead width W if the lead is formed by etching. The lead etching factor E.f is calculated by Equation 1 using the lead width W.

$$E.f = \frac{2T}{(B.W - T.W)} \quad (1)$$

Where, T is a lead thickness, B.W is a lead bottom width, and T.W is a width of the top surface of the lead.

Figure 5:
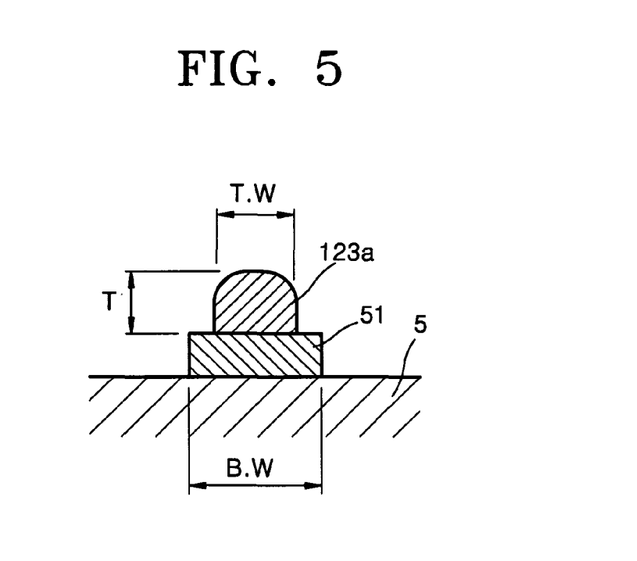
FIG. 5 is a cross-sectional diagram showing a connection of a lead and a bump.
Figure 6:
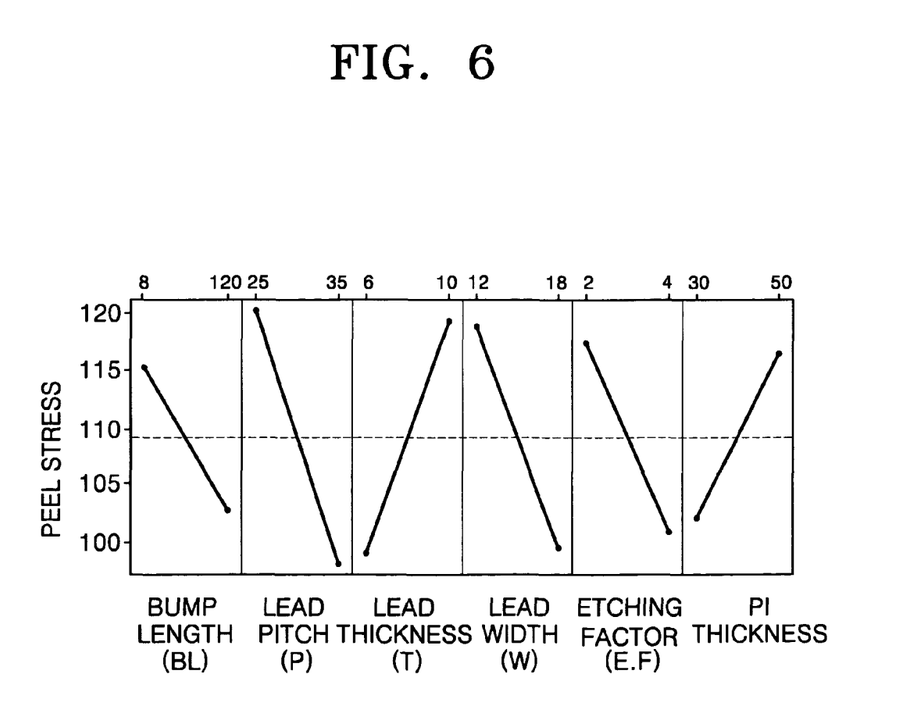
FIG. 6 is a graph showing results calculated through a FEM (Finite Element Method) considering selected parameters.

FIG. 5 is a view for representing the lead thickness T, the lead bottom width B.W, and the lead top-surface width T.W, described above. FIG. 6 is a graph showing results obtained when the FEM analysis is performed to the selected parameters.

It is seen in FIG. 6 that parameters that most influence the peel stress of the lead among the above-mentioned parameters are the lead pitch, the lead thickness, and the lead width. The lead thickness and the PI tape thickness preferably have small values, however, there is a limitation in decreasing the thicknesses, considering difficulties in a manufacturing process and electrical characteristics. Specifically, a level of relief for peel stress is capable of being obtained by decreasing the thicknesses is up to 20%.

Meanwhile, controlling the lead pitch or lead width is easily performed by changing only the lead pitch or lead width of the additional lead without changing the arrangement of the remaining leads. For example, in a case of a printed circuit board in which 30 μm pitch leads are formed and the lead width of each lead is 15 μm, a stress reduction of 30% can be obtained by changing the lead width to 25 μm of the additional lead. Also, it is possible to increase the lead width through a design method (for example, increasing the pitch using empty spaces of the edges of the printed circuit board). That is, the stress can be more reduced by adjusting the lead pitch and the lead width.

To reduce the stress concentration in lead frames in a design step, a chip length and a corner space also can be considered in addition to the above-mentioned parameters. The corner space represents a distance from an end of the semiconductor device 5 to the outer most lead. However, these parameters can be ignored since they have little influence on the change in the stress on the flexible printed circuit board in the present invention.

As a result, increasing the widths of the additional leads is most effective to prevent the adjacent outer most lead of leads 21 from being peeled off or damaged on a flexible printed circuit board with a lead pitch smaller than 30 μm.

Since a peel stress applied to the outer most lead of leads 21 depends on the widths of the additional leads regardless of the widths and pitches of other leads, it is important to change the widths of the additional leads.

Figure 7:
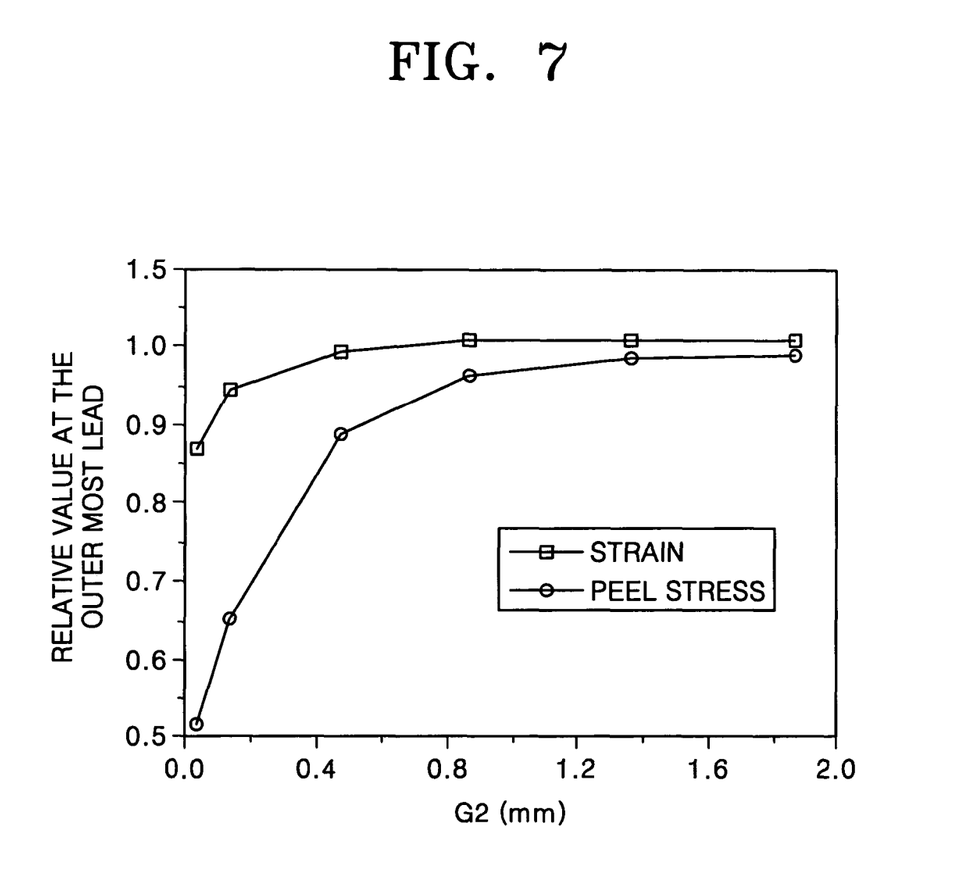
FIG. 7 is a graph showing changes in the magnitude of a stress applied on a lead according to the widths of edge gaps.

FIG. 7 is a graph showing changes in the magnitude of a stress applied on a lead adjacent to an additional lead according to distances between the additional lead and the adjacent outer most lead of leads 21.

As shown in the graph of FIG. 7, as the distance between the additional lead and the adjacent outer most lead of leads 21 increases, the same level of stress is applied to the additional lead and the adjacent outer most lead of leads 21 in the same mechanism. Accordingly, the relative magnitudes of strains and peel stresses of both the leads increase as the distance between both the leads increases.

Considering delamination as a main cause of breakage in the flexible printed circuit board, it is found that the magnitude of the peel stress is improved higher than 5% when the distance between the midpoint of the additional lead and the midpoint of the adjacent outer most lead of leads 21 is within 0.8 mm. That is, it is preferable that the distance between the additional lead and the adjacent lead is within 0.8 mm in the present invention.

According to the present invention, the additional leads with the wide width are formed near the edges, bumps, each size of which corresponds to the width of the additional lead, are formed at locations corresponding to the additional leads in the semiconductor device area, and the additional leads and the bumps are connected to each other. The connections of the additional leads and the bumps, rather than connections of the remaining leads and the bumps, bear a stress generated by the difference in the thermal expansion coefficients between the semiconductor device and the printed circuit board.

Figure 8:
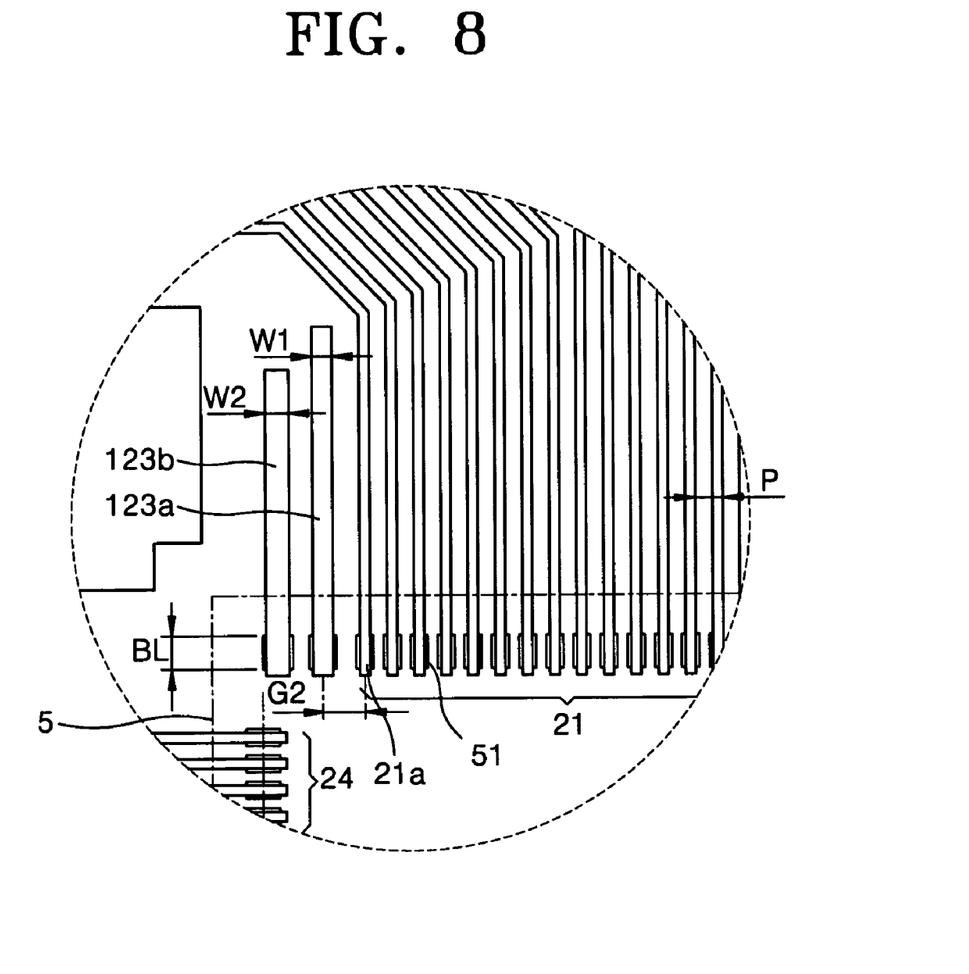
FIG. 8 is a view for explaining another embodiment of the present invention.

FIG. 8 is a view for explaining another embodiment of the present invention.

As shown in FIG. 8, two additional leads 123a and 123b are formed in a printed circuit board according to the present invention wherein the additional leads are not limited to two. The width W1 of the additional lead 123a, and a distance G2 between the additional lead 123a and the outer most lead 21a can be decided by the same process as described above. The additional lead 123b can be formed when more relief of stress concentration is required. The additional lead 123b has the same width as the lead 123a or a different width W2 as shown in FIG. 8.

The additional leads 123a and 123b may be dummy leads as shown in FIGS. 4 and 8 or may be signal lines.

As shown in FIG. 8, in the printed circuit board to which a stress concentration relief structure according to the present invention is applied, two or more additional wider leads 123a and 123b can be provided to ensure higher stability than when a single additional lead is formed. Because the shape of the semiconductor device is a rectangle and stresses are concentrated on the respective vertexes of the rectangle, the wide leads 123a and 123b are preferably formed near the respective vertexes of the semiconductor device 5, as shown in FIG. 8. The gap between the additional leads 123a and 123b is preferably wider than a pitch of other leads.

There is no change to the existing manufacturing process, except for manufacturing a master pattern in which the additional leads are formed and increasing the widths of the bumps formed near the vertexes of the semiconductor device in a design step of the semiconductor device and the flexible printed circuit board. The width of the additional lead is preferably equal to or wider than 20 µm as used in a general printed circuit board in which 40 µm pitch leads are formed.

Heretofore, a case where the semiconductor device is mounted on the flexible printed circuit board has been described, however, the present invention is not limited to the case and can be used to design inter-connections (between leads and bumps or between leads and balls) in a semiconductor chip package with a narrower width and a longer length.

Meanwhile, since the above descriptions are given in association with the semiconductor device with the rectangle form, the additional leads are formed near the outer most leads of the leads 21 located along the longer sides of the semiconductor device. This is because a stress concentration due to a distortion caused by the difference between the thermal expansion coefficients is more serious in the leads 21 located along the longer sides. However, if a difference is not great in stress concentration levels between the longer and shorter sides of the semiconductor device, it is also possible to form the additional leads near the outer most leads of the leads located along the minor sides.

The above descriptions regarding the design parameters are given in association with a flexible printed circuit board, however, the present invention is not limited to the flexible printed circuit board. The present invention can be used to relieve a stress concentration on outer most leads of leads that are arranged on a general printed circuit board as well as on a flexible printed circuit board.

As described above, according to the present invention, by providing an additional lead with width wider than 20 µm when leads with pitches smaller than 30 µm are formed, it is possible to effectively relieve a stress concentration on outer most leads due to a difference in thermal expansion coefficients between a semiconductor device and the printed circuit board while the semiconductor device is mounted on the printed circuit board.

Also, by limiting the edge gap within 0.8 mm, it is possible to prevent a stress from being concentrated on the leads except for the additional lead.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board, which includes an inner lead portion to be connected to a semiconductor device, the inner lead portion comprising:
   a plurality of parallel leads with substantially the same pitch between each of the plurality of leads;
   a first linear dummy lead parallel with and spaced apart from an outermost lead of the plurality of leads, the first linear dummy lead having a first length and a first width greater than or equal to about 0.67 times the pitch between the plurality of leads; and
   a second linear dummy lead parallel with and adjacent to the first linear dummy lead, the second linear dummy lead having a second width and a second length, a gap between the first and second linear dummy leads being greater than the pitch between the plurality of leads.

2. The printed circuit board of claim 1, wherein at least one of the second width and the second length is the same as the first width and the first length, respectively.

3. The printed circuit board of claim 1, wherein at least one of the second width and the second length is different than the first width and the first length, respectively.

4. The printed circuit board of claim 3, wherein the first linear dummy lead is adjacent to the outermost lead of the plurality of leads, the first width being less than the second width, and the first length being greater than the second length.

5. The printed circuit board of claim 1, wherein the first linear dummy lead is adjacent to the outermost lead of the plurality of leads, the first width being greater than 20 µm and each of the plurality of leads having a pitch smaller than 30 µm.

6. The printed circuit board of claim 1, wherein the first linear dummy lead is adjacent to the outermost lead of the plurality of leads, a distance between a midpoint of the first linear dummy lead and a midpoint of the outermost lead of the plurality of leads being within 0.8 mm.

7. The printed circuit board of claim 1, wherein at least one of the first and second linear dummy leads is wider than any individual lead in the plurality of leads.

8. The printed circuit board of claim 1, wherein the printed circuit board is a flexible printed circuit board.

* * * * *